(12) United States Patent
Lamb et al.

(10) Patent No.: US 6,515,917 B2
(45) Date of Patent: Feb. 4, 2003

(54) DIGITAL-TO-ANALOG CONVERTER (DAC) FOR DYNAMIC ADJUSTMENT OF OFF-CHIP DRIVER PULL-UP AND PULL DOWN IMPEDANCE BY PROVIDING A VARIABLE REFERENCE VOLTAGE TO HIGH FREQUENCY RECEIVER AND DRIVER CIRCUITS FOR COMMERCIAL MEMORY

(75) Inventors: Kirk D. Lamb, Kingston, NY (US); Kevin C. Gower, LaGrangeville, NY (US); Edward N. Cohen, Kingston, NY (US)

(73) Assignee: International Business Machines Corporation, Armonk, NY (US)

(*) Notice: Subject to any disclaimer, the term of this patent is extended or adjusted under 35 U.S.C. 154(b) by 3 days.

(21) Appl. No.: 09/829,628

(22) Filed: Apr. 10, 2001

(65) Prior Publication Data

US 2002/0145919 A1 Oct. 10, 2002

(51) Int. Cl.$^7$ .................................................. G11C 7/00
(52) U.S. Cl. .................... 365/189.09; 365/226; 365/201
(58) Field of Search ........................... 365/189.09, 226, 365/201, 233

(56) References Cited

U.S. PATENT DOCUMENTS 6,147,914 A * 11/2000 Leung et al. .......... 365/189.09
6,301,167 B1 * 10/2001 Lee et al. .................... 365/201
6,301,184 B1 * 10/2001 Sasaki et al. ................ 365/226

* cited by examiner

Primary Examiner—Huan Hoang
(74) Attorney, Agent, or Firm—Lynn L. Augspurger

(57) ABSTRACT

A memory subsystem package has a memory controller interface ASIC (application specific integrated circuit) and a plurality of Memory modules. The ASIC has a bi-directional serial protocol i2C communication bus to off chip drivers for monitoring temperature and for adjusting the environment surrounding the package by controlling fans using fan switches and variable voltage controls. In addition there is provided an Alternating Current Built in Self Test (AC BIST) with variable data receiver voltage reference for performing high-speed AC memory subsystem self-test for that ASIC enabling writing of pseudo-random patterns to memory, reading them back and comparing the expected results at hardware speeds. Vref can be made to vary across its allowable range during AC self test to provide improved coverage. The system monitors Vddq during normal system operation using an ADC. The system varies Vref as a function of Vddq, using a combination of a DAC and ADC. The system varies Vref as a function of Vddq, such that Vref=1/m*Vddq+OFFSET, where m can be 1, 2, 4, or 8, and where OFFSET can be positive or negative ranging from 1/n * Vddq to n−1/n*Vddq, where n is the voltage granularity of the DAC.

3 Claims, 2 Drawing Sheets

DIGITAL-TO-ANALOG CONVERTER (DAC) FOR DYNAMIC ADJUSTMENT OF OFF-CHIP DRIVER PULL-UP AND PULL DOWN IMPEDANCE BY PROVIDING A VARIABLE REFERENCE VOLTAGE TO HIGH FREQUENCY RECEIVER AND DRIVER CIRCUITS FOR COMMERCIAL MEMORY

RELATED APPLICATIONS

These co-pending applications and the present application are owned by one and the same assignee, International Business Machines Corporation of Armonk, New York.

A Digital Temperature Sensor (DTS) System to monitor temperature in a memory subsystem, by inventors: Kirk D. Lamb and Kevin C. Gower, under U.S. Ser. No. 09/829,633.

An Analog-toDigital Converter for monitoring VDDQ and dynamically updating programmable Vref when using high-frequency receiver and driver circuits for commercial memory, by inventors: Kirk D. Lamb and Kevin C. Gower, filed Apr. 10, 2001, under U.S. Ser. No. 09/829,636.

An Alternating Current Built-in Self Test (AC BIST) with variable data receiver voltage reference for performing high-speed AC memory subsystem self-test, by inventors: Kirk D. Lamb, Paul W. Coteus, and Kevin C. Gower, filed Apr. 10, 2001, under U.S. Ser. No. 09/829,630.

The descriptions set forth in these co-pending applications are hereby incorporated into the present application by this reference. Trademarks: IBM is a registered trademark of International Business Machines Corporation, Armonk, N.Y., U.S.A. Other names may be registered trademarks or product names of International Business Machines Corporation or other companies.

FIELD OF THE INVENTION

This invention relates to a digital temperature sensor (DTS) system to monitor temperature in a memory subsystem, and particularly one capable of monitoring both ambient air or packaging surface temperature at multiple locations in a coupled commercial DRAM memory array.

BACKGROUND

The present inventions were created in a development directed to using commercial memory products to be used with a memory interface for IBM products. Representative of the commercial memories is the memory of Samsung Electronics Co., Ltd's represented by their DDR-II SDRAM (Synchronous Dynamic Random Access Memory).

As this application is directed to temperature sensing, we note that patents have been granted for temperature sensing of semiconductor chips at multiple locations. Examples of such patents include the U.S. Pat. No. 5,994,752 for a field-effect-controllable semiconductor component with a plurality of temperature sensors, as filed by Rainald Sander and Alfons Graf for the assignee, Siemens Aktiengesellschaft, Munich, Germany. In this U.S. Pat. No. 5,994,752 patent issued Nov. 30, 1999 a field-effect-controllable power semiconductor component, such as a power MOSFET or IGBT, includes a semiconductor body, at least one cell field, a multiplicity of mutually parallel-connected transistor cells disposed in at least one cell field, and at least two temperature sensors integrated in the semiconductor body and disposed at different locations from each other on the semiconductor body. Thus a temperature gradient between a strongly heated local region of the semiconductor body and one of the temperature sensors is reduced and a response time in the event of an overload is shortened.

U.S. Pat. No. 6,144,085 of Richard J. Parker, issued Nov. 7, 2000 for a power transistor device having hot-location and cool-location temperature sensors, was assigned to U.S. Philips Corporation, New York, N.Y. In this U.S. Pat. No. 6,144,085 patent a power transistor device, for example a MOSFET or an IGBT, provided a semiconductor chip which accommodates an array of parallel device cells in which heat is generated in operation of the chip device. A hot-location temperature sensor was located inside the array, and a cool-location temperature sensor was located outside the array. Each of these sensors have at least one sensor cell which is of the same transistor type as the device cells. The sensor cells have a cellular region structure similar to that of the device cells, but each sensor has a respective output electrode separate from electrodes of the device cells. A detection circuit is coupled to the respective output electrodes of the hot-location and cool-location temperature sensors for detecting a temperature difference between the hot and cool locations by comparing voltage signals from the output electrodes.

In Shoichi Furuhata's U.S. Pat. No. 5,521,421 for a semiconductor device issued May 28, 1996 to Fuji Electric Co., Ltd., Hino, Japan, there was described a semiconductor device with a power element on a substrate, and the device had a temperature monitor element formed on the same substrate. In case of thermal overload in the power element, a signal from the temperature monitor element could be used for turning the power element off. For enhanced temperature response, the temperature monitor element was partly surrounded by the power element or/and disposed beneath an integrated, thermally conductive extension of an electrode of the power element.

However, while temperature sensing techniques like those indicated above for semiconductor chips have been known, these prior teachings do not address the need for a digital temperature sensor (DTS) to monitor either ambient air or packaging surface temperature in a memory subsystem when the memory itself is designed by others or is a commercial product, as is the custom today with the use of industry standard components. The temperature inside the commercial memory subsystem can vary over time, and an effective, accurate, and low-cost method is needed to monitor the temperature. In creating this solution, it is also recognized that there are commercial sensing devices which can be mounted in a higher level package, which can be monitored with special hardware, which, however, do not meet the needs to which our invention is directed.

In the related invention an Analog-to-Digital Converter (ADC) is used to monitor Vddq. Here it should be noted that U.S. Pat. No. 5,206,944 for high speed analog to digital converter board for memory applications for an IBM PC/AT has issued Apr. 27, 1993 to inventor Michael D. Pilkenton and assigned to The United States of America as represented by the Secretary of the Air Force, Washington, D.C. In this patent a flash analog-to-digital converter (ADC) was provided in a single IC package which has an analog input coupled to a video signal source. The data line from the ADC circuit goes to a SRAM (Static Random Access Memory) memory made up of four identical banks which are interleaved together so that slower less costly memory chips can be used. In this device an interface circuit provides communication between the computer and a digitizer, with address, data and control lines. The U.S. Pat. No. 5,206,944 digitizer, which comprises integrated circuit cards designed to attach to an expansion slot in an IBM PC/AT, operates at 20 megasamples per second for approximately 52 milliseconds and provides eight bit resolution on the signal input.

The computer software includes a device driver for the digitize A sync pulse from the video tape unit which is monitored by a sync pulse input comparator to trigger the start of a digitizing sequence. Thus, we can recognize ADCs have been used in memory interface applications.

Also, some vendors include a Digital Temperature Sensor (DTS) in the same component as the ADC. Examples of this are the Analog Devices, Inc.'s AD7417 and AD 7418, which contain a DTS and either four or one ADC respectively. These devices are not being used to monitor memory subsystem temperatures.

SUMMARY OF THE INVENTION

In order to use the representative commercial memory SDRAMs we have achieved a way to allow signals to access a Samsung Electronics Co., Ltd's DDR-II SDRAM (Synchronous Dynamic Random Access memory) which includes on-chip registers, described in its specification, which implement a programmable CAS latency, and a programmable additive latency to ensure a tRCDmin specification is met. The present application describes separate inventions described in this application which do not affect or alter the contents of these registers, and do not make use of the contents of the Samsung registers, and yet enable a commercial SDRAM memory such as the Samsung DDR-II SDRAM to be used in a standard memory subsystem for IBM using a new ASIC (application specific integrated circuit).

The preferred embodiment of the invention uses a Digital Temperature Sensor (DTS) system to monitor either ambient air or packaging surface temperature in a memory subsystem which uses a variety of separate coupled commercial memory parts not necessarily manufactured by the creator of the memory subsystem. In accordance with the preferred embodiment of the invention, a Digital Temperature Sensor DTS is connected to an ASIC which serves as a memory controller for the separate coupled memory chips supplied by various commercial vendors of state of the art memory, such as memories meeting standards developed by the JEDEC standards committee and marketed by member supporters of the standards committee, for example the Double Data Rate or DDR memories like those of Samsung Electronics Co., Ltd. as represented by its DDR-II SDRAM (Synchronous Dynamic Random Access Memory).

There have been many improvements to the interface for controlling a memory subsystem comprising plural arrays of SDRAM in the form of a plurality of SDRAM memory chips which are made to operate with a memory subsystem control system utilizing our developments with a new memory controller interface ASIC (application specific integrated circuit). Our system varies Vref during initial adjustment of the pull-up and pull down impedance of a DDR-II SDRAM off-chip data drivers. The system finds an optimum impedance setting for the DDR-II SDRAM off-chip driver pull-up and pull-down impedance during initialization. The system monitors Vddq during normal system operation using an ADC. The system varies Vref as a function of Vddq, using a combination of a DAC and ADC. The system varies Vref as a function of Vddq, such that Vref=1/m*Vddq+OFFSET, where m can be 1, 2, 4, or 8, and where OFFSET can be positive or negative ranging from 1/n*Vddq to n--1/n*Vddq, where n is the voltage granularity of the DAC.

The overall system monitors surface temperature, ambient air temperature, or both at one or more locations in a memory subsystem using one ASIC and one or more DTS. One or more fans are controlled in order to control as well as monitor surface and ambient air temperature. The memory subsystem has a Built In AC Self Test. This system writes pseudo-random patterns to memory, reading them back and comparing the expected results at hardware speeds. The system varies Vref across its allowable range during Built In AC Self Test to provide improved self-test coverage.

These and other improvements are set forth in the following detailed description so as to enable a clearer understanding of our claimed inventions. For a better understanding of the invention with advantages and features, refer to the description and to the drawings.

Our detailed description explains the preferred embodiments of our invention, together with advantages and features, by way of example with reference to the drawings which are applicable to the claimed inventions and related applications.

DETAILED DESCRIPTION OF THE INVENTION

Figure 1:
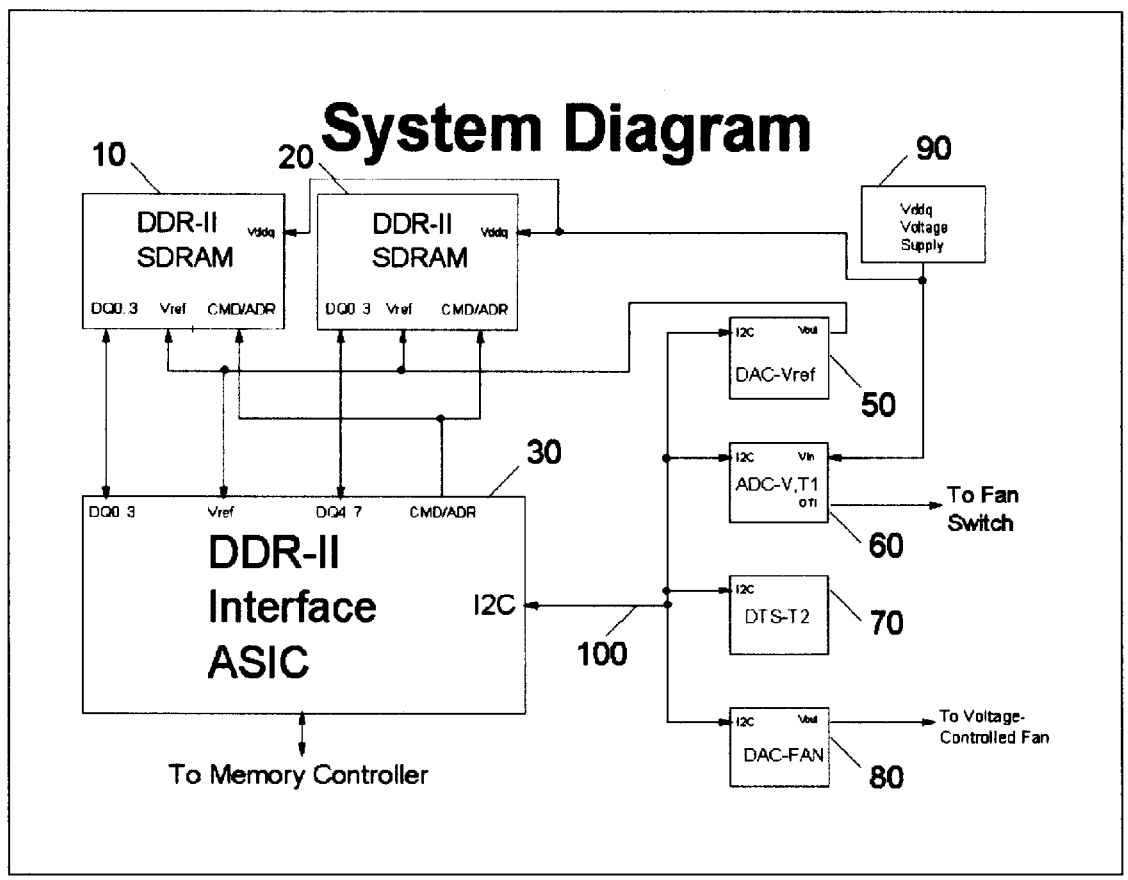
FIG. 1 illustrates a block diagram of the preferred embodiment at the system level.

The memory controller DDR-II Interface ASIC (the application specific integrated circuit DIA 30 in the FIG. 1) servers as the memory controller of the memory subsystem package where it is connected to commercial SDRAM chips, such as the preferred Double Data Rate (version II) DDR-II SDRAM modules 10 and 20 manufactured by Samsun Electronics. In a typical application the DIA will be connected to more than two memory modules, but two represents the plurality of memory modules and will suffice to describe the invention. As illustrated in FIG. 1 the DDR-II SDRAM comprises two coupled commercial separate memory modules in the form of the Samsung DDR-II SDRAM 10 and Samsung DDR-II SDRAM 20 each of which are manufactured in accordance with the Samsung specification and have four data bits, DQ0 through DQ3. DDR-II SDRAM with more data bits (e.g. 8 or more) are also available and could be used, but the number of data bits is not relevant to the inventions described here. A common reference voltage Vref is supplied by the voltage reference circuit we call DAC-Vref 50. This voltage reference (Vref) is common to DIA 30 and to both DDR-II SDRAM modules 10 and 20, and would also be common to more DDR-II modules if more were required.

The DDR-II Interface ASIC (DIA) 30 is connected via an internal bi-directional communication (I2C) bus 100 to the voltage reference circuit (DAC-Vref) 50, and to an analog-to-digital converter (ADC) voltage or temperature adjustment circuit (ADC-V,T1) 60, as well as to our second temperature Digital Temperature Sensor (DTS) we call a DTS-T2 70, and a circuit for a voltage controlled fan within the chip called DAC-FAN 80.

DAC-Vref 50 receives its commands from our DDR-II Interface ASIC DIA 30 via the I2C bus 100, and provides a reference voltage Vref on its output pin Vout. This voltage is applied to the Vref input pins on the DDR-II SDRAM modules 10 and 20, and the Vref input pin on the DIA 30.

ADC-V,T1 60 is also controlled by the DDR-II Interface ASIC DIA 30 via the I2C bus 100. This analog-to-digital converter supplies digital readings of Vddq provided by the Vddq Power Supply 90 and supplies digital readings of either the surface mount temperature or ambient air temperature, depending upon how it is affixed to the surface of its carrier (typically a card). The DIA 30 writes configuration commands to ADC-V,T1 60 via the I2C bus 100, causes ADC-V,T1 to perform voltage or temperature conversions, and reads these digital values from ADC-V,T1 60 via the I2C bus.

In such an implementation of our preferred embodiment the Over-Temperature Indicator (OTI) output pin of ADC-V,T160 is connected to a switch controlling a fan. If the temperature goes above a programmed threshold, the OTI pin drives an active value, and is used to switch a fan on. If the fan cools the temperature below the threshold, the OTI pin goes to its inactive value, and switches the fan off.

DTS-T2 70 is a digital temperature sensor, monitoring a second temperature in addition to the temperature monitored by ADC-V,T1. It is controlled by DIA 30 via the I2C bus 100, and provides a digital reading to DIA 30 via the I2C bus 100.

The fan voltage control output of DAC-FAN 80 is controlled by DIA 30 via the I2C bus 100. This fan voltage control circuit illustrates our second method for controlling the memory sub-system temperature. If DIA 30 detects an over-temperature condition after reading ADC-V,T1 60 or DTS-T2 70, it raises the voltage output of DAC-FAN 80 by programming DAC-FAN 80 with a new value over the I2C bus 100. The DAC-FAN 80 control circuit output is connected to a voltage controlled fan. The higher the voltage, the faster the fan rotates.

The Over-Temperature Indicator (OTI) output of ADC-V,T1 60 and the voltage control output of DAC-FAN provide two different cooling solutions. In the preferred embodiment provision is made for the use of two fans. A fan which is connected to ADC-V,T1 will be either on or off. The fan which is connected to DAC-FAN is a variable speed fan and can provide a more precise control of the temperature. The DAC-FAN variable speed implementation may also has less power consumption.

The Vddq Voltage Supply 90 circuit is connected to the Vddq input pins of the DDR-II SDRAMs 10 and 20, and provides a voltage input for the Vin pin of the ADC-V,T1 60.

Figure 2:
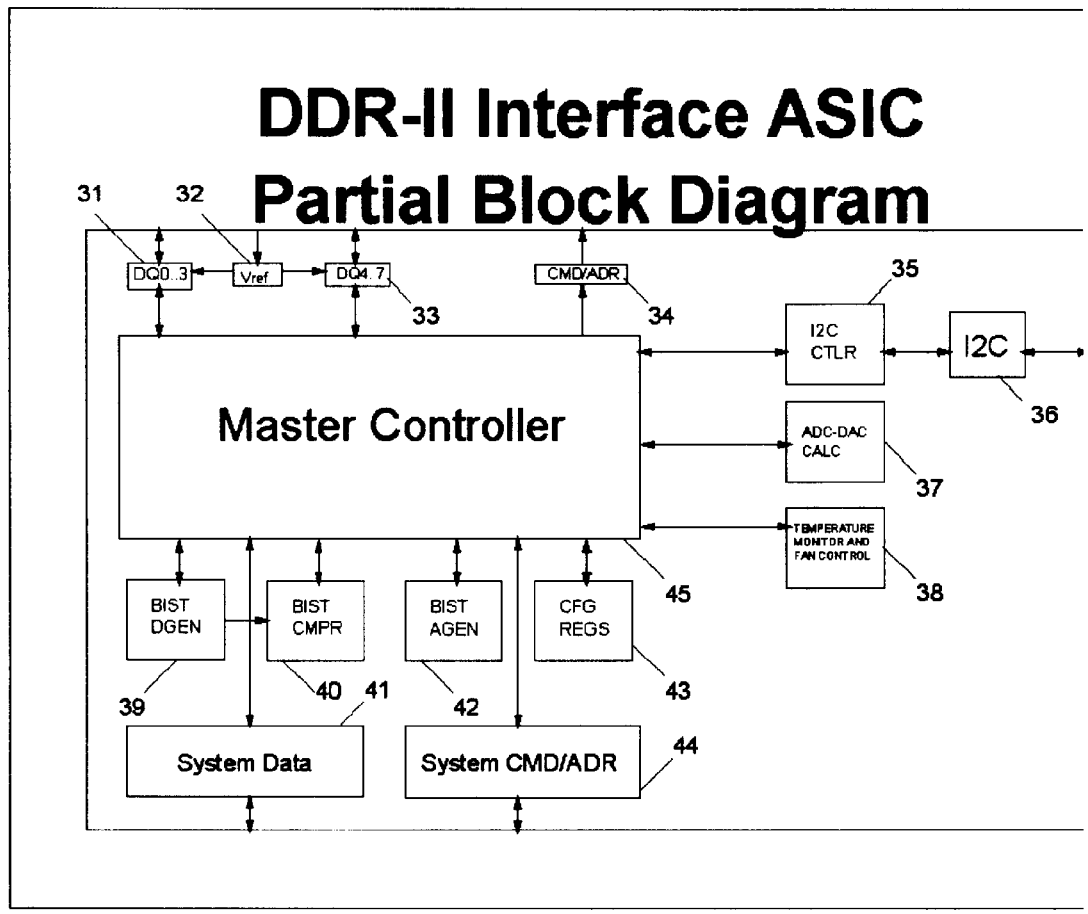
FIG. 2 illustrates a block diagram of the components required in an memory controller (DDR-II) interface ASIC 30 in FIG. 1 in order to perform the functions required at the system level.

FIG. 2 shows a detailed implementation of a subset of our DDR-II Interface ASIC DIA 30, specifically the subset required to implement the preferred embodiment of these inventions.

The data bi-directional drivers and receivers 31, 33 receive data from the DDR-II SDRAMs 10, 20 of FIG. 1, and send the data to the master controller 45. They also receive data from the master controller 45, and send that data to the DDR-II SDRAMs 10, 20. They receive a reference voltage from the Vref receiver 32.

The master controller 45 sends commands and addresses to the DDR-II SDRAMs 10, 20 of FIG. 1 via the CMD/ADR bus 34.

In order to write to or read from one of the devices 50, 60, 70, 80 connected to the I2C bus 100 of FIG. 1, the master controller 45 communicates via the I2C controller 35, which places data onto the I2C bus according to the I2C bus protocol. The I2C bus controller 35 writes to or reads from the I2C bus via the I2C bi-directional driver/receivers contained in block 36.

During normal operation, when Vref is supposed to be a function of Vddq (typically ½ Vddq), the master controller reads the Vddq voltage via ADC-V,T1 60 of FIG. 1, and sends it to the ADC-DAC (Analog-to-Digital-Digital-to-Analog) CALC module 37. The ADC-DAC CALC module 37 calculates the appropriate value to be written to DAC-Vref 50 of FIG. 1, and sends it to the master controller 45. The master controller 45 then writes the new value to DAC-Vref 50 via the I2C bus controller 35.

The "Temperature Monitor and Fan Control" module 38 is required if a DAC-FAN 80 chip is used for a voltage controlled fan. The temperature is read by the master controller 35 from either ADC-V,T160 or DTS-T2 70, and sent to the "Temperature Monitor and Fan Control" module 38. This module then determines the voltage output setting for DAC-FAN 80 voltage control circuit. It sends the value to the master controller, which writes a new value to DAC-FAN 80 circuit via the I2C bus controller 35.

The circuit named BIST DGEN 39 provides Built In Self Test data generation. It is a pseudo-random pattern generator. In the embodiment, a series of Linear Feedback Shift Registers (LFSR) were used to provide a register bank equal to the width of the number of DQ pins. This generates a pseudo-random pattern which can be written to the DDR-II SDRAM 10, 20 during AC BIST (Alternating Current Built In Self Test).

The circuit named BIST AGEN 42 provides Built In Self Test address generation. In the embodiment, it is a register which increments through the address space of the DDR-II SDRAM during AC BIST.

The circuit BIST CMPR 40 is used during the compare portion of AC BIST, which is described later.

The circuit CFG REGS 43 provides an array of configurable registers. Read registers provide the master controller information such as a seed value for the LFSR of BIST DGEN 39, the starting address for BIST AGEN 42, and the addresses of the I2C devices 50, 60, 70 and 80 of FIG. 1. Results of initial driver impedance adjustment, and AC BIST are written to the CFG REGS 43. CFG REGS 43 must be accessible to the system. In this embodiment they are read or written via system command and address registers CMD/ADR 44 through the master controller 45, and into the configurable registers of the array CFG REGS 43.

Registers named System Data 41 (outputing to the data port of the SDRAMs 10, 20) and the command and address registers of System CMD/ADR 44 (outputting to the CMD/ADR port of the the SDRAMs 10, 20) are used during normal system operation to send data to and from the DDR-II SDRAMS. During normal operation, the master controller sends commands and addresses from System CMD/ADR 44 to a DDR-II SDRAM via CMD/ADR 34. During AC BIST, the master controller sends commands and addresses to a DDR-II SDRAM from BIST AGEN 42. During normal operation, the master controller sends data from System Data 41 to DDR-II SDRAM via the data DQ pins 31, 33, and vice-versa when sending data from DDR-II SDRAM to the system. During AC BIST, the master controller sends data to DDR-II SDRAM from BIST DGEN 39.

During AC BIST the master controller adjusts Vref to a specified value stored in the CFG REGS, according to the above previously described method of adjusting Vref by writing to DAC-Vref. The master controller then performs one or more iterations of AC BIST. The master controller first writes pseudo-random data to DDR-II SDRAM by seeding the LFSR of BIST DGEN from data in CFG REGS, and by initializing the starting address of BIST AGEN from the CFG REGS. The master controller signals BIST DGEN to shift its Linear Feedback Shift Registers (LFSR) when it signals BIST AGEN to increment its address. After all the data has been written to the DDR-II SDRAM, the master controller initializes BIST DGEN and BIST AGEN, and reads the data from one or more of the DDR-II SDRAMs. The data from the DDR-II SDRAM(S) and BIST DGEN are provided to BIST CMPR, and a compare is performed on the actual data received against the expected value provided by BIST DGEN. A count of failing bits and number of fails is maintained by BIST CMPR. Upon the completion of AC BIST, the master controller writes the results of the AC BIST from BIST CMPR to CFG REGS, which makes the information available to the system. Each write to memory, read from memory, and compare cycle can be considered an iteration at constant Vref. The master controller can then adjust Vref and repeat another iteration. The CFG REGS can be written in a manner so that the master controller steps through various settings of Vref, at each Vref setting performing a DDR-II write, read, and compare iteration.

AC BIST as described in this embodiment is run at the maximum speed of the DDR-II Interface ASIC DIA (30) and the DDR-II SDRAMs 10, 20. This provides the fastest possible method of running AC BIST in the memory subsystem.

In implementing our invention in the most cost effective way we have used a Digital Temperature Sensor which is an off-the-shelf component. Appropriate off-the-shelf components could be the LM92 Digital Temperature Sensor of National Semiconductor Corporation or alternatively the Philips Semiconductors: HECETA 4 Temperature and voltage monitor, or other like component which we can attach to the memory subsystem package, and to the ASIC via some connection. In the preferred implementation an I2C (Philips Corporation trademark) bus, a 2 bit serial bus with clock and data, as available from Philips Corporation is used. The ASIC monitors the temperature via the LM92 DTS in accordance with the invention by using a DTS attached to the RAM interface ASIC via an I2C bus. I2C is a standard serial bus connection which was developed some 20 years ago for imbedded applications. See http://www-us2.semiconductors.philips.com/i2c/ which illustrates the standard i2c bus. The ASIC constantly monitors the temperature at one or multiple locations (note the description herein related to the use of a Digital-to-Analog Converter (DAC) to provide reference voltage to high frequency receiver/driver circuits for dynamic adjustment of off-chip driver pull-up and pull-down impedance and the use of a Analog-to-Digital Converter (ADC) to monitor Vddq and dynamically update programmable Vref when using the off-chip high-frequency receiver/driver circuits). This offers advantages in reliability in that the running system can verify that the temperature specification is being met by the user. Temperature specification violations can be reported by the system's error reporting system. Variable voltage fans can be connected to the system, so that the fan speed is increased if the temperature rises above a limit, and decreased or shut off if the temperature drops below a threshold. Such fan control has power usage and noise benefits. This system also provides valuable information during bring-up and field failure analysis. Memory defects are difficult to analyze, and having temperature data as part of the failure analysis can reveal temperature-defect relationships.

As a result of the preferred embodiment, the temperature inside the memory subsystem can vary over time, yet there is now an effective, accurate, and low-cost method used to monitor the temperature. Further, the preferred embodiment also provides a means to control the temperature in addition to monitoring it. This can be done in multiple ways.

One way is to connect a switch to the over-temperature indicator (OTI) on the ADC. In this method the maximum allowed temperature is written to a register in the ADC, and the ADC is configured to raise or lower the OTI output when the threshold temperature is exceeded. This OTI output is then used to complete a switch to a fan, starting the fan when the temperature exceeds a threshold.

A more complex method, which allows more precise control of the temperature, adds a DAC to the I2C bus. The DAC output provides an input to a variable speed fan, controlled by the DAC output voltage. The DDR-II Interface ASIC DIA 30 would control the DAC so that its output voltage increases as the temperature increases, thus running the fans at higher rates as temperature increases.

While other details of the ADC are described it will be noted here that the ADC along with the related DAC can be used with Samsung DDR-II memory modules (SDRAM) which will contain off-chip data drivers which have variable impedance pull-up and pull-down adjustment. Samsung has introduced programmable off-chip driver impedance with its future release of DDR-II memory modules and this interface is suitable for an interface with these SDRAM modules. This DAC solution enables use of their new commercial product. At a minimum, during system initialization the DDR-II control unit (typically in our DDR-II Interface ASIC DIA 30 connected to the DDR-II modules, but in any case external to the DDR-II modules) must execute a routine in which the impedance of the DDR-II data drivers is adjusted so that data integrity is maintained. During this routine, we enable the necessary dynamic adjustment of the reference voltage supplied to the data receiver circuits. The DAC can also be used to adjust Vref after initialization, while the system is running, to adjust Vref based on system changes in supply voltage or temperature. The related DAC provides a DAC connected to the DDR-II Interface ASIC DIA 30 which is controlled by this ASIC, with the DAC output connected to the reference voltage (Vref) input of the receiver circuit. By using a serial communications protocols such as that of the I2C, ACCESS.bus, and SMBus. The serial communication interface such as our preferred use of the Philips Corporation's i2c bus (Philips and i2C are trademarks of Philips Corporation) to connect the DAC, only 2 ASIC IOs are required to implement the solution. Also, multiple devices can be attached to the I2C bus, so our implementation of our invention with multiple Vref can be supplied with a single system.

In connection with the commercial memory devices (SDRAMs as manufactured in accordance with the JEDEC with which the invention is used, reference voltages are typically supplied with physical implementations, such as resistor voltage dividers, which are not dynamically adjustable. Before the described DAC embodiment was developed if a Vref had to be modified in this environment, we had to perform a physical rework to the system (typically a printed circuit board with mounted devices), which means the system must be powered off, cards removed, reworked, and reinstalled. This DAC invention enables real-time, dynamic adjustment of Vref, both at the time of system initialization and while the memory subsystem is running normal operations.

Referring now to the related use of an Analog-to-Digital Converter (ADC) to monitor Vddq and dynamically update programmable Vref when using high-frequency receiver/driver circuits, the Analog-to-Digital Converter (ADC) has its analog input connected to Vddq, and provides digital output to our DDR-II Interface ASIC DIA 30. The ASIC is used for controlling DDR-II memory modules. The ASIC monitors the value of Vddq via the ADC, and uses the value of Vddq to dynamically compute and adjust the reference voltage of receivers of high-frequency data buses. This ADC solves the problem of dynamically adjusting Vref as a function of Vddq, which may vary during system operation. The advantage is that the ADC provides dynamic adjustment, monitoring of Vddq, using standard industry components at minimal cost in ASIC IO (only two ASIC Ios are required if a Philips I2C bus compatible device is used). This ADC solution uses an I2C bus, so only two ASIC IOs are required. As the I2C bus allows multiple devices, the ADC can be on the same bus as the DAC so no additional ASIC IO are required. Alternatively, but not our preferred embodiment, one would implement a less desirable solution to the problem by providing a voltage divider circuit, which is a piece of hardware that requires rework if it must be adjusted. By using an ADC, the ASIC can get a digital input of the value of Vddq, and compute a new value of Vref. The ASIC can be programmed to select one of several equations for computing the new Vref, based upon the system and its operating conditions. One system may perform best with Vref equal to ½ Vddq. But another system may perform best with Vref at a higher or lower voltage than ½ Vddq. This ADC as provided allows these multiple Vref voltages without requiring card rework. This is especially important during system bring-up, when it may be discovered that an expected Vref value does not result in expected system performance. The Vref can then be adjusted by programming the ASIC differently, rather than by pulling cards and reworking them. This can significantly reduce bring-up time.

Configuration registers enable the equation for Vref to be varied as a function of Vddq. In the preferred embodiment as shown, Vref=1/n Vddq+OFFSET, where n can be programmed as 1, 2, 4, or 8, and OFFSET is a signed binary number with a bit width one greater than the DAC voltage register. In the embodiment described the DAC has a 10 bit voltage register, which allows changes of Vref as small as (1/1024)*Vddq.

In accordance with the preferred embodiment of the invention the temperature sensing is done at the memory subsystem package, where the ASIC and the memory modules reside. Both surface temperature and ambient air temperature can be measured. Since the Philips I2C bus allows multiple devices to be attached, the temperature can be measured at multiple locations with no additional pin-count for the ASIC. Since the Analog-to-Digital Converter (ADC) of our application is used in the memory subsystem anyway, the temperature monitoring ability is obtained at no cost of additional components in the system. Logic is added to the ASIC to monitor the temperature and since the ASIC is not silicon bound, there is plenty of room for the additional logic added with the ADC application. So no additional hardware is required.

This invention is useful and implemented in an ASIC standard modular interface which serves as a memory controller for memory chips supplied by various commercial vendors of state of the art memory illustrated by the Samsung DDR memory modules, but it can be implemented with other memory chips of other manufacturers for compatible memory subsystem usage.

While the preferred embodiment of the invention has been described, it will be understood that those skilled in the art, both now and in the future, may make various improvements and enhancements which fall within the scope of the claims which follow. These claims should be construed to maintain the proper protection for the invention first described.

What is claimed is:

1. An application specific intergrated chip (ASIC) control system to provide and adjust a reference voltage Vref for commercial memory chips in a memory subsystem, comprising:

a memory subsystem package including a memory controller interface ASIC and a plurality of memory modules each having a supply voltage Vddg supplied thereto from a voltage supply, each of said memory modules comprising separately manufactured memory chips which reside in said memory subsystem as part of said memory subsystem package and which receive a reference voltage Vref during memory operations and are accessed for read/write memory operations from said memory controller interface ASIC, said memory controller interface having a serial communication protocol port, and a serial communication protocol bus connected to said serial communication protocol port for passing bi-directional signals to and from said memory controler interface ASIC, a plurality of programmable off chip data drivers having a variable impedance pull-up pull-down adjustment, and an initialization adjustment dynamically adjusting said reference voltage Vref of said pluality of memory modules to an initial reference voltage Vref, and wherein said variable impedance pull-up pull-down adjustment is programmably adjustable while the memory subsystem is running during normal operations based on changes in said supply voltage, and further comprising a digital-to-analog-converter (DAC) connected to said memory controller interface ASIC and controlled by said ASIC with the DAC output being coupled to a reference voltage (Vref) input of for each of said plurality of memory modules.

2. The application specific intergrated chip control system to provide and adjust the reference voltage for commercial memory chips in a memory subsystem according to claim 1, wherein during normal operation of said memory modules, when said reference voltage Vref is normally a function of the supply voltage Vddq, the memory controller interface ASIC reads the supply voltage Vddq via a analog-to-digital-converter circuit and sends it to a ADC-DAC (Analog-to-Digital-Digital-to-Analog) calculation module which calculates the appropriate value to be written to a digital-to-analog-converter voltage reference control circuit, and sends it to the ASIC which then writes the new value to for said initial reference voltage Vref via a bus controller for said bi-directional serial communication bus.

3. The application specific intergrated chip control system to provide and adjust the reference voltage for commercial memory chips in a memory subsystem according to claim 2 wherein said bi-directional serial communication bus is an i2C bus and said bus controller is an i2c bus controller, and said reference voltage is supplied to the plurality of memory modules.

* * * * *